(12) United States Patent
Sugimoto et al.

(10) Patent No.: US 8,659,454 B2
(45) Date of Patent: Feb. 25, 2014

(54) TIME ERROR ESTIMATING DEVICE, ERROR CORRECTION DEVICE AND A/D CONVERTER

(75) Inventors: Tomohiko Sugimoto, Yokohama (JP);
Takafumi Yamaji, Yokohama (JP);
Junya Matsuno, Kawasaki (JP);
Masanori Furuta, Odawara (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 16 days.

(21) Appl. No.: 13/425,332

(22) Filed: Mar. 20, 2012

(65) Prior Publication Data

US 2013/0076545 A1    Mar. 28, 2013

(30) Foreign Application Priority Data

Sep. 26, 2011    (JP) .................................. 2011-209672

(51) Int. Cl.
*H03M 1/06* (2006.01)

(52) U.S. Cl.
USPC .......................................... 341/118; 341/120

(58) Field of Classification Search
USPC .................................. 341/155, 120, 118, 141
See application file for complete search history.

(56) References Cited

U.S. PATENT DOCUMENTS 7,084,793 B2    8/2006 Elbornsson
7,253,762 B2 *  8/2007 Huang et al. .................. 341/155

OTHER PUBLICATIONS

Oshimda et al., "LMS Calibration of Sampling Timing for Time-Interleaved A/D Converters" IET Electronics Letter, vol. 45, No. 12, pp. 615-617, Jun. 4, 2009.
Oshimda et al., "On-Chip Background Calibration of time interleaved ADC", IEICE Technical Report ICD2010-34 (Jul. 2010).

* cited by examiner

*Primary Examiner* — Joseph Lauture
(74) *Attorney, Agent, or Firm* — Knobbe Martens Olson & Bear LLP

(57) ABSTRACT

A time error estimating device for estimating a sampling time error of each of a plurality of sampling circuits when the sampling circuits generates a plurality of sampling output signals by performing sampling at timings shifted from one another has correlators each configured to obtain a correlation value representing a similarity between the sampling output signals, and a weight adder configured to estimate the sampling time error of the sampling circuits, based on a result obtained by adjusting a weight on the correlation value.

19 Claims, 3 Drawing Sheets

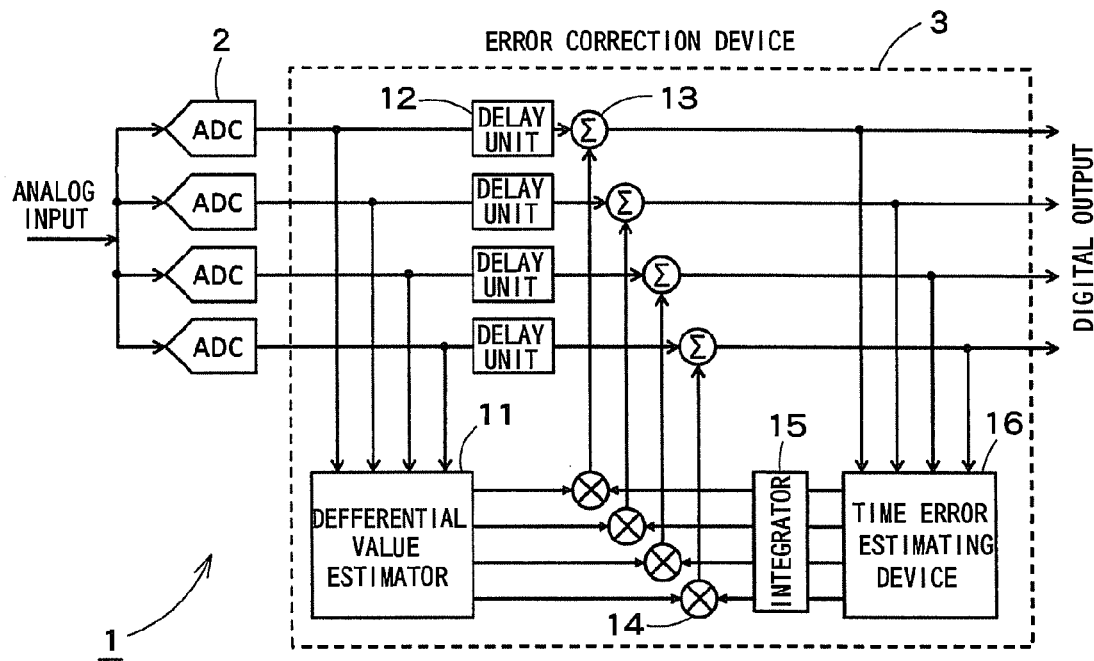
F I G. 1
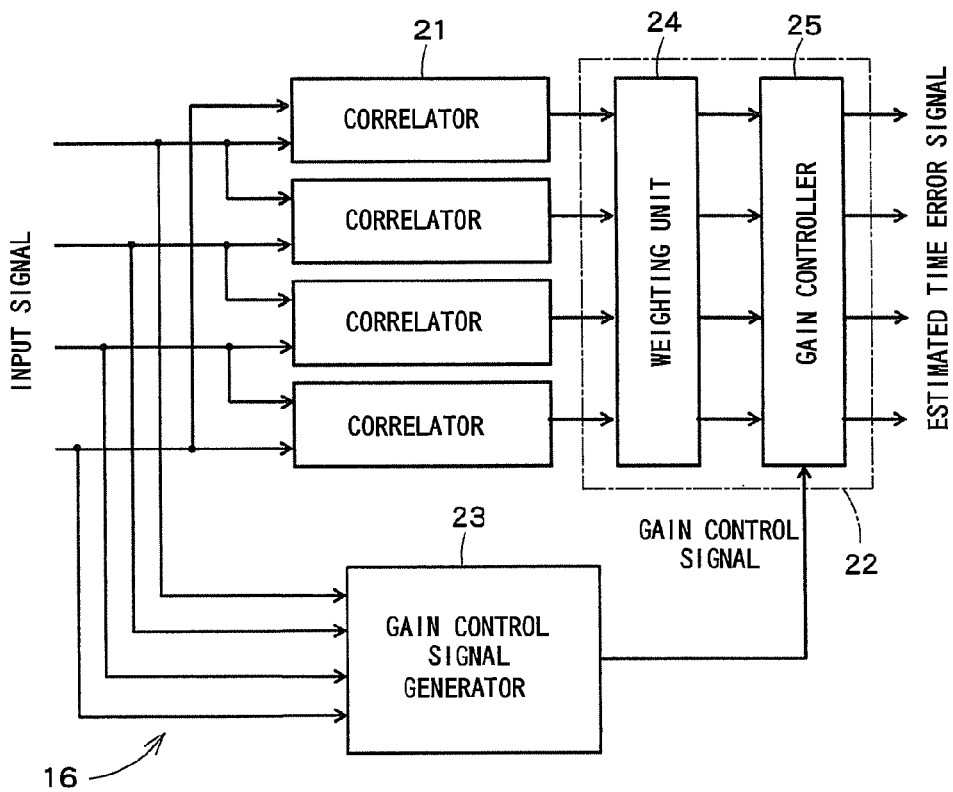
F I G. 2

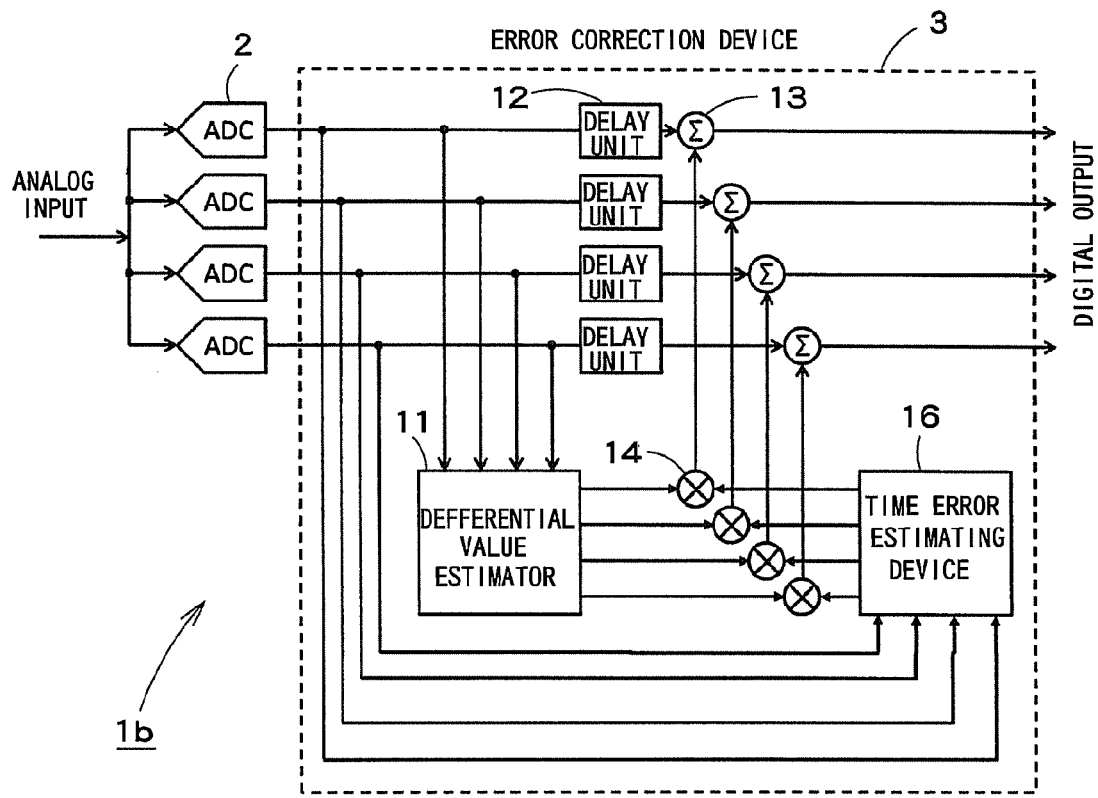
F I G. 6
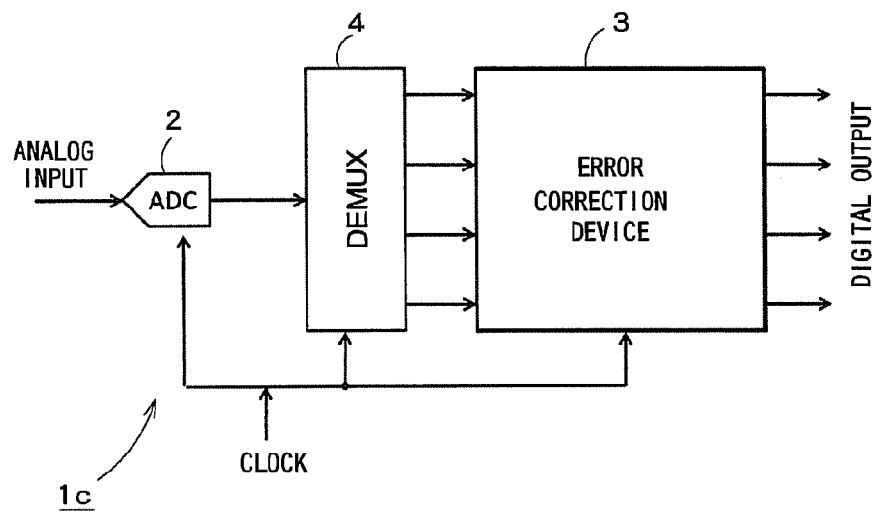
F I G. 7

TIME ERROR ESTIMATING DEVICE, ERROR CORRECTION DEVICE AND A/D CONVERTER

CROSS REFERENCE TO RELATED APPLICATIONS

This application is based upon and claims the benefit of priority from the prior Japanese Patent Application No. 2011-209672, filed on Sep. 26, 2011, the entire contents of which are incorporated herein by reference.

FIELD

Embodiments of the present invention relate to a time error estimating device for estimating sampling time errors of a plurality of input signals, and an A/D converter having this time error estimating device.

BACKGROUND

There has been popularized an A/D converter of a time interleaving manner which has a plurality of A/D converting units performing A/D conversion equivalently and at high speed, each A/D converting unit operating at timings shifted from one another.

If a plurality of A/D converting units have exactly the same electrical characteristics, the A/D converter will have the same A/D conversion characteristics as those of an A/D converter having a single A/D converting unit. However, actually, variation in the A/D conversion characteristics occurs even when the A/D converting units are formed on the same semiconductor chip.

The variation in A/D conversion characteristic is caused by three factors of direct-current offset, gain error, and sampling time error. In these factors, direct-current offset and gain error can be detected and corrected by a relatively simple method known as a conventional method. However, there is no established method to detect and correct a sampling time error.

A prior art concerning the sampling time error shows an example where sampling time errors of a plurality of A/D converting units are estimated so that each A/D converting unit corrects the sampling time. Also, it has been proposed to arrange a complicated filter to estimate the sampling time error of each A/D converting unit. However, when the structure of the filter becomes complicated, the circuit scale of the A/D converter is increased, which leads to the increase in power consumption.

In another proposed technique, a reference A/D converting unit is arranged to output a reference signal, and the output signals of the other A/D converting units are compared to the reference signal, in order to simplify the calculation for estimating the error of each A/D converting unit. In this technique, the output signal of the reference A/D converting unit influences the accuracy of the entire system. Further, the reference A/D converting unit to be arranged separately increases the circuit scale of the A/D converter.

BRIEF DESCRIPTION OF THE DRAWINGS

FIG. 1 is a block diagram showing an example of a schematic structure of an A/D converter according to a first embodiment.

FIG. 2 is a block diagram showing an example of the internal structure of a time error estimating device 16 of FIG. 1.

FIG. 6 is a block diagram showing a schematic structure of an A/D converter 1b according to a third embodiment.

FIG. 7 is a block diagram showing a schematic structure of an A/D converter 1c according to a fourth embodiment.

DETAILED DESCRIPTION

Figure 3:
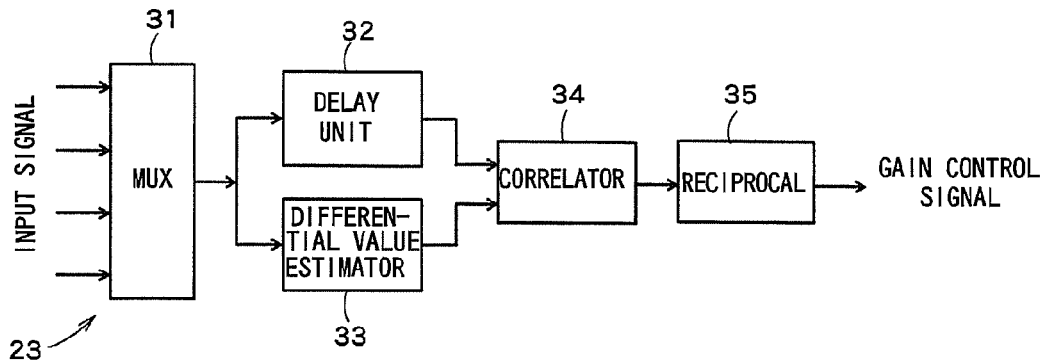
FIG. 3 is a block diagram showing an example of the internal structure of a gain control signal generator 23.

According to one aspect of the present embodiment, a time error estimating device for estimating a sampling time error of each of a plurality of sampling circuits when the sampling circuits generates a plurality of sampling output signals by performing sampling at timings shifted from one another has correlators each configured to obtain a correlation value representing a similarity between the sampling output signals, and a weight adder configured to estimate the sampling time error of the sampling circuits, based on a result obtained by adjusting a weight on the correlation value.

Embodiments of the present invention will now be explained with reference to the accompanying drawings.

(First Embodiment)

FIG. 1 is a block diagram showing an example of a schematic structure of an A/D converter according to a first embodiment. An A/D converter 1 of FIG. 1 has a plurality of A/D converting units 2 for performing A/D conversion at timings shifted from one another, and an error correction device 3.

The timing of A/D conversion performed by each A/D converting unit 2 is shifted by one clock. In the example of FIG. 1, four A/D converting units 2 are arranged, and thus each A/D converting unit 2 performs A/D conversion at a frequency of once per four clocks. Even when the operation speed of each A/D converting unit 2 is slow, the A/D converter 1 as a whole performs A/D conversion at an operation speed four times faster than that of each A/D converting unit 2, thereby realizing a high-speed A/D converter.

The error correction device 3 has a differential value estimator 11, a plurality of delay units 12, a plurality of error removers 13, a plurality of multipliers 14, an integrator 15, and a time error estimating device 16. The differential value estimator 11 estimates the differential values of the output signals of the A/D converting units 2. The delay units 12 delay the output signals of the A/D converting units 2. Each delay unit 12 delays the output signal of its corresponding A/D converting unit 2 by a time required to estimate the differential value by the differential value estimator 11. Accordingly, the timing of the output signal of the delay unit 12 and that of the differential value outputted from the differential value estimator 11 can be matched with each other.

Each of the error removers 13 generates a digital output signal by removing a sampling time error of the A/D converting unit 2 from the output signal of the delay unit 12. The digital output signal is called a plurality of sampling output signals.

The number of delay units 12, error removers 13, and multipliers 14 is the same as the number of A/D converting units 2.

The time error estimating device 16 generates error signals each corresponding to the sampling time error of the A/D converting unit 2. The integrator 15 performs an integration process to accumulate the error signal generated by the time error estimating device 16 within a predetermined time range.

Each of the multipliers 14 multiplies the error signal accumulated by the integrator 15 and the differential value. The multiplication result of the multiplier 14 is transmitted to the error remover 13. The error remover 13 corrects the sampling time error of the A/D converting unit 2 by subtracting the multiplication result of the multiplier 14 from the output signal of the delay unit 12.

FIG. 2 is a block diagram showing an example of the internal structure of the time error estimating device 16 of FIG. 1. The time error estimating device 16 of FIG. 2 has a plurality of correlators 21, a weight adder 22, and a gain control signal generator 23.

Each of the correlators 21 obtains a correlation value representing the similarity between the digital output signals outputted from the A/D converter 1.

The weight adder 22 estimates the sampling time error of each A/D converting unit 2, based on a result obtained by adjusting the weight on the correlation value by the differential value of the output signal of each A/D converting unit 2. More specifically, the weight adder 22 has a weighting unit 24 and a gain controller 25. The weighting unit 24 weights the correlation value. The gain controller 25 adjusts the gain of the output signal of the weighting unit 24.

The gain control signal generator 23 generates a gain control signal to adjust the amplitude of the estimated time error signal.

Hereinafter, the operating principle of the time error estimating device 16 according to the present embodiment will be explained. It is assumed that y(nT) represents the A/D converted output signal when each A/D converting unit 2 performs sampling at an ideal sampling time nT, and y(nT+Δt) represents the A/D converted output signal when each A/D converting unit 2 performs sampling at a timing shifted from the ideal sampling time nT by Δt. In this case, the relationship as shown in the following Formula (1) is established.

$$y(nT+\Delta t) \approx y(nT) + y'(nT)\Delta t \tag{1}$$

where y' (nT) is the differential value of y(nT). By transforming this Formula (1), the ideal A/D converted output signal y(nT) can be expressed by the following Formula (2).

$$y(nT) \approx y(nT+\Delta t) - y'(nT)\Delta t \tag{2}$$

y' (nT) can be estimated by using a finite impulse response filter (FIR filter), for example. To the contrary, it is not easy to estimate the sampling time error Δt. In the present embodiment, Δt is estimated by the following steps.

It is defined that the A/D converter 1 has four A/D converting units 2, and original A/D converted output signals outputted from the A/D converting units 2 are y((4m+1)T), y((4m+2)T), y((4m+3)T), and y((4m+4)T). When sampling timing errors of the A/D converting units 2 are Δt1, Δt2, Δt3, and Δt4, the actual A/D converted output signals of the A/D converting units 2 are y((4m+1)T+Δt1), y((4m+2)T+Δt2), y((4m+3)T+Δt3), and y((4m+4)T+Δt4).

Accordingly, the A/D converted output signals of the first and second A/D converting units 2 in the four A/D converting units 2 can be expressed by the following Formulas (3) and (4), respectively.

$$y((4m+1)T+\Delta t1) \approx y((4m+1)T) + y'((4m+1)T)\Delta t1 \tag{3}$$

$$y((4m+2)T+\Delta t2) \approx y((4m+2)T) + y'((4m+2)T)\Delta t2 \tag{4}$$

A correlation value R21 representing the similarity between the A/D converted output signals in Formulas (3) and (4) can be expressed by the following Formula (5).

$$R_{21} = \lim_{k \to \infty} \frac{1}{2k} \sum_{m=-k}^{k} y((4m+2)T+\Delta t_2)y((4m+1)T+\Delta t_1) \tag{5}$$

$$= \overline{y((4m+2)T+\Delta t_2)y((4m+1)T+\Delta t_1)}$$

$$\approx \overline{y((4m+2)T)y((4m+1)T)} + \overline{y((4m+2)T)y'((4m+1)T)}\Delta t_1 +$$

$$\overline{y((4m+1)T)y'((4m+2)T)}\Delta t_2$$

$$\approx \overline{y((n+1)T)y(nT)} + \overline{y((n+1)T)y'(nT)}\Delta t_1 +$$

$$\overline{y(nT)y'((n+1)T)}\Delta t_2$$

In the above Formula (5), it is assumed that the auto-correlation function of the ideal A/D converted output signal does not depend on the type of the A/D converting unit 2. Further, in the above Formula (5), it is assumed that the correlation value between the A/D converted output signals of the first and second A/D converting units 2 is equal to the correlation value between the A/D converted output signals of the second and third A/D converting units 2. The same can be applied to the differential values of the A/D converted output signals. Further, errors Δt1 and Δt2 are far smaller than the original values (4m+1)T and (4m+2)T, and first-order approximation is established, and thus the terms of errors of second order or higher are omitted. Further, in the above Formula (5), the bar on each signal name means an average value.

When approximating the differential values y' (nT) and y' ((n+1)T) by an FIR filter, the following Formula (6) is established.

$$y'(nT) = \sum_{i} c_i y((n-i)T) \tag{6}$$

Note that "$c_i$" is a tap coefficient of the FIR filter. Since the relationship that $c_{-i}=-c_i$ is established, the following Formula (7) is established.

$$\overline{y(nT)y'((n+1)T)} = \sum_{i} c_i \overline{y(nT)y((n+1-i)T)} \tag{7}$$

$$= \sum_{i} -c_{-i} \overline{y(nT)y((n+1-i)T)}$$

$$= -\sum_{l} c_l \overline{y(nT)y((n+1+l)T)}$$

$$= -\sum_{l} c_l \overline{y((n-l)T)y((n+1)T)}$$

$$= -\overline{y((n+1)T)y'(nT)}$$

In the above Formula (7), temporal change in statistical properties of the signal is ignored, and it is assumed that the following Formula (8) is established.

$$\overline{y(nT)y((n+1+l)T)} = \overline{y((n-l)T)y((n+1)T)} \tag{8}$$

As stated above, this Formula (8) shows that each A/D converting unit 2 has the same correlation value.

When applying the above Formula (7) to Formula (5), the correlation value R21 can be expressed by the following Formula (9).

$$R_{21} = \overline{y((4m+2)T+\Delta t_2)y((4m+1)T+\Delta t_1)} \tag{9}$$

$$\approx \overline{y((n+1)T)y(nT)} + \overline{y(nT)y'((n+1)T)}(\Delta t_2 - \Delta t_1)$$

When transforming this Formula (9), the time difference ($\Delta t_2 - \Delta t_1$) can be expressed by the following Formula (10).

$$\Delta t_2 - \Delta t_1 = \frac{\overline{y((4m+2)T+\Delta t_2)y((4m+1)T+\Delta t_1)} - \overline{y((n+1)T)y(nT)}}{\overline{y(nT)y'((n+1)T)}} \quad (10)$$

$\Delta t_1 - \Delta t_4$, $\Delta t_3 - \Delta t_2$, and $\Delta t_4 - \Delta t_3$ also can be expressed similarly to the above Formula (10).

Assuming that the total of the sampling time errors $\Delta t_i$ of the A/D converting units 2 is zero, namely $\Delta t_1 + \Delta t_2 + \Delta t_3 + \Delta t_4 = 0$, the time error $\Delta t_i$ can be expressed by the following Formula (11).

$$\begin{bmatrix} \Delta t_1 \\ \Delta t_2 \\ \Delta t_3 \\ \Delta t_4 \end{bmatrix} = \frac{1}{4}\begin{bmatrix} 3\Delta t_1 - (\Delta t_2 + \Delta t_3 + \Delta t_4) \\ 3\Delta t_2 - (\Delta t_3 + \Delta t_4 + \Delta t_1) \\ 3\Delta t_3 - (\Delta t_4 + \Delta t_1 + \Delta t_2) \\ 3\Delta t_4 - (\Delta t_1 + \Delta t_2 + \Delta t_3) \end{bmatrix} = \frac{1}{4}\begin{bmatrix} 1 & -2 & -1 & 0 \\ 0 & 1 & -2 & -1 \\ -1 & 0 & 1 & -2 \\ -2 & -1 & 0 & 1 \end{bmatrix}\begin{bmatrix} \Delta t_1 - \Delta t_4 \\ \Delta t_2 - \Delta t_1 \\ \Delta t_3 - \Delta t_2 \\ \Delta t_4 - \Delta t_3 \end{bmatrix} \quad (11)$$

By substituting Formula (10) into the third term on the right-hand side of the above Formula (11), the time error $\Delta t_i$ can be obtained.

In the example explained above, four A/D converting units 2 are arranged in the A/D converter 1. When the number of A/D converting units 2 in the A/D converter 1 is p (p is an arbitrary integer of 2 or greater), the time error $\Delta t_i$ (i is an integer of 1 to p) can be expressed by the following Formulas (12) and (13).

$$\begin{bmatrix} \Delta t_1 \\ \Delta t_2 \\ \vdots \\ \Delta t_p \end{bmatrix} = \frac{1}{p}\begin{bmatrix} (p-1)\Delta t_1 - (\Delta t_2 + \Delta t_3 + \ldots + \Delta t_p) \\ (p-1)\Delta t_2 - (\Delta t_3 + \Delta t_4 + \ldots + \Delta t_p + \Delta t_1) \\ (p-1)\Delta t_3 - (\Delta t_4 + \Delta t_5 + \ldots + \Delta t_p + \Delta t_1 + \Delta t_2) \\ \vdots \\ (p-1)\Delta t_p - (\Delta t_1 + \Delta t_2 + \ldots + \Delta t_{p-1}) \end{bmatrix} \quad (12)$$

$$\frac{1}{p}\begin{bmatrix} (p-1)\Delta t_1 - (\Delta t_2 + \Delta t_3 + \ldots + \Delta t_p) \\ (p-1)\Delta t_2 - (\Delta t_3 + \Delta t_4 + \ldots + \Delta t_p + \Delta t_1) \\ (p-1)\Delta t_3 - (\Delta t_4 + \Delta t_5 + \ldots + \Delta t_p + \Delta t_1 + \Delta t_2) \\ \vdots \\ (p-1)\Delta t_{p-1} - (\Delta t_p + \Delta t_1 + \Delta t_2 + \ldots + \Delta t_{p-2}) \\ (p-1)\Delta t_p - (\Delta t_1 + \Delta t_2 + \ldots + \Delta t_{p-1}) \end{bmatrix} = \quad (13)$$

$$\frac{1}{p}\begin{bmatrix} 1 & -(p-2) & -(p-3) & \ldots & -1 & 0 \\ 0 & 1 & -(p-2) & \ldots & -2 & -1 \\ -1 & 0 & 1 & \ldots & -3 & -2 \\ \vdots & & & \ddots & & \vdots \\ -(p-3) & -(p-4) & -(p-5) & \ldots & 1 & -(p-2) \\ -(p-2) & -(p-3) & -(p-4) & \ldots & 0 & 1 \end{bmatrix}\begin{bmatrix} \Delta t_1 - \Delta t_p \\ \Delta t_2 - \Delta t_1 \\ \vdots \\ \Delta t_p - \Delta t_{p-1} \end{bmatrix}$$

When simplifying the above Formula (9) by replacing the first term on the right-hand side by a constant C, and replacing the second term on the right-hand side by a coefficient A, the case where p=4 can be expressed by the following Formula (14).

$$R_{ij} = A(\Delta t_i - \Delta t_j) + C \quad (14)$$

Here, each of i and j is an arbitrary integer of 1 to 4. To remove the constant C of the above Formula (14), the constant C should be canceled by eliminating the difference between Formulas (14) each having different i and j. In this way, the following Formula (15) is obtained.

$$A\begin{bmatrix} \Delta t_1 - \Delta t_4 \\ \Delta t_2 - \Delta t_1 \\ \Delta t_3 - \Delta t_2 \\ \Delta t_4 - \Delta t_3 \end{bmatrix} = \frac{1}{4}\begin{bmatrix} 3 & -1 & -1 & -1 \\ -1 & 3 & -1 & -1 \\ -1 & -1 & 3 & -1 \\ -1 & -1 & -1 & 3 \end{bmatrix}\begin{bmatrix} R_{14} \\ R_{21} \\ R_{32} \\ R_{43} \end{bmatrix} \quad (15)$$

When expanding Formula (15) to a general formula for the case where p A/D converting units 2 are arranged in the A/D converter 1, Formula (16) is obtained.

$$A\begin{bmatrix} \Delta t_1 - \Delta t_p \\ \Delta t_2 - \Delta t_1 \\ \vdots \\ \Delta t_p - \Delta t_{p-1} \end{bmatrix} = \frac{1}{p}\begin{bmatrix} p-1 & -1 & \ldots & -1 \\ -1 & p-1 & & \vdots \\ \vdots & & \ddots & -1 \\ -1 & \ldots & -1 & p-1 \end{bmatrix}\begin{bmatrix} R_{1p} \\ R_{21} \\ \vdots \\ R_{p(p-1)} \end{bmatrix} \quad (16)$$

The time error $\Delta t_i$ when four A/D converting units 2 are arranged in the A/D converter 1 can be expressed by the following Formula (17), by substituting Formula (15) into the right-hand side of the above Formula (11).

$$A\begin{bmatrix} \Delta t_1 \\ \Delta t_2 \\ \Delta t_3 \\ \Delta t_4 \end{bmatrix} = \frac{1}{16}\begin{bmatrix} 1 & -2 & -1 & 0 \\ 0 & 1 & -2 & -1 \\ -1 & 0 & 1 & -2 \\ -2 & -1 & 0 & 1 \end{bmatrix}\begin{bmatrix} 3 & -1 & -1 & -1 \\ -1 & 3 & -1 & -1 \\ -1 & -1 & 3 & -1 \\ -1 & -1 & -1 & 3 \end{bmatrix}\begin{bmatrix} R_{14} \\ R_{21} \\ R_{32} \\ R_{43} \end{bmatrix} = \quad (17)$$

$$\frac{1}{8}\begin{bmatrix} 3 & -3 & -1 & 1 \\ 1 & 3 & -3 & -1 \\ -1 & 1 & 3 & -3 \\ -3 & -1 & 1 & 3 \end{bmatrix}\begin{bmatrix} R_{14} \\ R_{21} \\ R_{32} \\ R_{43} \end{bmatrix}$$

Similarly, the time error $\Delta t_i$ when p A/D converting units 2 are arranged in the A/D converter 1 can be expressed by the following Formula (18), by substituting Formula (16) into the right-hand side of the above Formula (13).

$$A\begin{bmatrix} \Delta t_1 \\ \Delta t_2 \\ \vdots \\ \Delta t_4 \end{bmatrix} = \frac{1}{p^2}\begin{bmatrix} p-1 & -1 & \ldots & -1 \\ -1 & p-1 & & \vdots \\ \vdots & & \ddots & -1 \\ -1 & \ldots & -1 & p-1 \end{bmatrix} \quad (18)$$

-continued $$\begin{bmatrix} 1 & -(p-2) & -(p-3) & \cdots & -1 & 0 \\ 0 & 1 & -(p-2) & \cdots & -2 & -1 \\ -1 & 0 & 1 & & -3 & -2 \\ \vdots & & & \ddots & & \vdots \\ -(p-3) & -(p-4) & -(p-5) & \cdots & 1 & -(p-2) \\ -(p-2) & -(p-3) & -(p-4) & \cdots & 0 & 1 \end{bmatrix} \begin{bmatrix} R_{1p} \\ R_{21} \\ \vdots \\ R_{p(p-1)} \end{bmatrix}$$

As will be understood from Formula (17) and Formula (18), the constant C of Formula (14) is canceled through the calculation, but the coefficient A is still remaining. Accordingly, in the present embodiment, the gain control signal generator 23 is arranged in the time error estimating device 16 to cancel the coefficient A by obtaining the value of the coefficient A as a gain and multiplying the gain by its reciprocal by the weight adder 22.

FIG. 3 is a block diagram showing an example of the internal structure of the gain control signal generator 23. The gain control signal generator 23 of FIG. 3 has a multiplexer (MUX) 31, a delay unit 32, a differential value estimator 33, a correlator 34, and a reciprocal calculator 35.

The multiplexer 31 sequentially selects one of four A/D converted output signals outputted from the A/D converting unit 2.

The differential value estimator 33 estimates the differential value of the A/D converted output signal selected by the multiplexer 31. This differential value estimator 33 is formed using an FIR filter, for example.

The delay unit 32 delays the A/D converted output signal selected by the multiplexer 31 by a processing time of the differential value estimator 33. As stated above, the delay unit 32 is arranged to synchronize the A/D converted output signal selected by the multiplexer 31 with the differential value estimated by the differential value estimator 33.

The correlator 34 obtains a correlation value representing the similarity between the A/D converted output signal selected by the multiplexer 31 and the differential value. This correlation value corresponds to the coefficient A in the above Formula (17).

The reciprocal calculator 35 calculates the reciprocal of the correlation value obtained by the correlator 34, and supplies this reciprocal to the weight adder 22 in order to cancel the coefficient A.

Next, the operation of the A/D converter 1 according to the first embodiment will be explained. This A/D converter 1 has four A/D converting units 2 for performing A/D conversion at sampling timings shifted from one another. Therefore, the phases of the A/D converted output signals outputted from the A/D converting units 2 are also shifted from one another.

The differential value estimator 11 estimates the differential value of each A/D converted output signal using an FIR filter etc. Each delay unit 12 delays each A/D converted output signal by a time required to estimate the differential value by the differential value estimator 11. That is, the delay unit 12 performs a process for synchronize the A/D converted output signal with the differential value Each error removers 13 generates a final digital output signal by subtracting the multiplication value of the time error Δti and the differential value from the A/D converted output signal, in accordance with the above Formula (2). This digital output signal is inputted into the time error estimating device 16 for feedback control.

The time error estimating device 16 calculates the time error Δti in accordance with Formula (17). Here, the coefficient A in Formula (17) is previously calculated by the gain control signal generator 23, and the coefficient A is canceled by being multiplied by its reciprocal.

The time error Δti estimated by the time error estimating device 16 is accumulated in the integrator 15. More concretely, the integrator 15 accumulates the time error with respect to each A/D converting unit 2. Therefore, in each A/D converting unit 2, the value obtained by multiplying the output of the integrator 15 and the differential value corresponds to y' (nT) Δt in the above Formula (2). By removing this value from the A/D converted output signal by the error remover 13, the final digital output signal is obtained.

In the present embodiment, feedback control is performed on the sampling time error so that the input into the integrator 15 becomes zero, and thus stabilization is achieved when the sampling time error becomes zero. Accordingly, in a stable state, the time error Δti estimated by the time error estimating device 16 becomes zero, and no sampling time error is generated in each A/D converting unit 2.

As stated above, in the first embodiment, by estimating a correlation value between the A/D converted output signals outputted from the A/D converting units 2 in the A/D converter 1, and multiplying this correlation value by a weight, the sampling time error of each A/D converting unit 2 is obtained, and feedback control is performed so that this time error becomes zero. Accordingly, the sampling time error of each A/D converting unit 2 can be corrected with high accuracy.

In particular, the present embodiment does not require a reference A/D converter for outputting a reference A/D converted output value, nor a complicated filter for estimating a sampling time error. Accordingly, the time error can be corrected with high accuracy with relatively simple hardware or software configuration.

(Second Embodiment)

A second embodiment is characterized in that two A/D converting units 2 are arranged in the A/D converter 1 instead of four A/D converting units 2.

Figure 4:
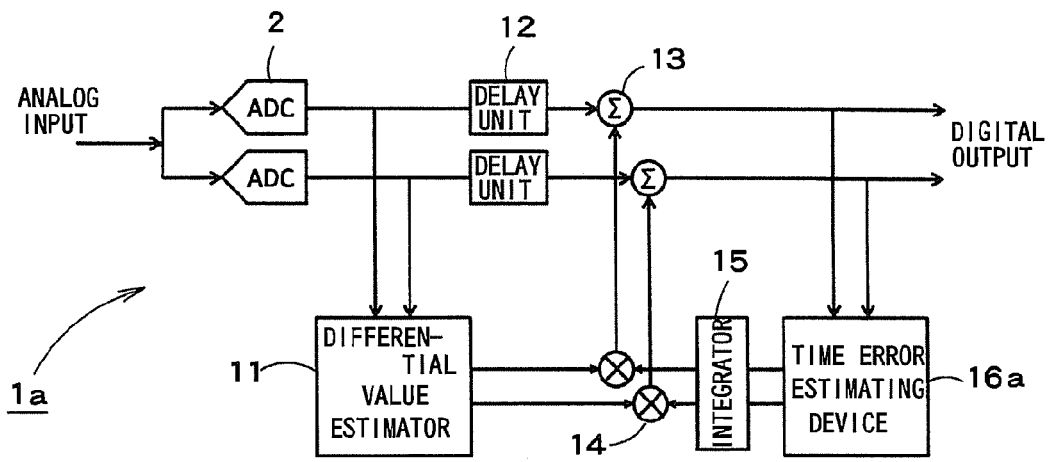
FIG. 4 is a block diagram showing a schematic structure of an A/D converter 1a according to a second embodiment.

FIG. 4 is a block diagram showing a schematic structure of an A/D converter 1a according to the second embodiment. As will be understood from the comparison with FIG. 1, the A/D converter 1a of FIG. 4 is different from the A/D converter 1 of FIG. 1 in that the number of delay units 12, error removers 13, and multipliers 14 to be arranged is two. The other components are similar to FIG. 1.

Figure 5:
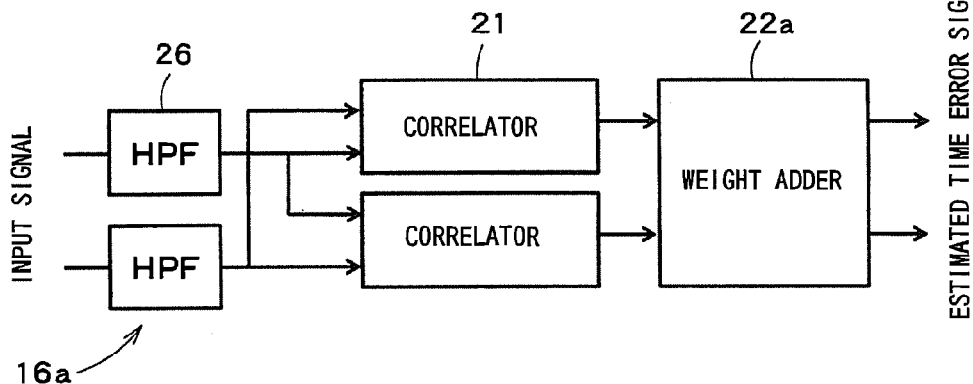
FIG. 5 is a block diagram showing the internal structure of a time error estimating device 16a according to the second embodiment.

FIG. 5 is a block diagram showing the internal structure of a time error estimating device 16a according to the second embodiment. The time error estimating device 16a of FIG. 5 is different from the time error estimating device 16 of FIG. 2 in that a highpass filter (HPF) 26 is connected in the former stage of the correlator 21, the number of correlators 21 to be arranged is two, the gain control signal generator 23 is not arranged, and the gain controller 25 is not arranged in a weight adder 22a.

The highpass filter 26 removes a direct current component included in the final digital output signal outputted from the A/D converter 1a. The highpass filter 26 is arranged since the correlation value should be estimated fundamentally using the signals removed of direct current components. Therefore, also in FIG. 2, the highpass filter 26 may be connected in the former stage of the correlator 21. Further, to the contrary, the highpass filter 26 may be omitted from the time error estimating device 16a of FIG. 5 to simplify the block structure.

The weight adder 22a of FIG. 5 outputs a difference signal between two input signals. That is, the weight adder 22 performs the calculation in accordance with the following Formula (19).

$$A \begin{bmatrix} \Delta t_1 \\ \Delta t_2 \end{bmatrix} = \frac{1}{2} \begin{bmatrix} 1 & -1 \\ -1 & 1 \end{bmatrix} \begin{bmatrix} A(\Delta t_1 - \Delta t_2) + C \\ A(\Delta t_2 - \Delta t_1) + C \end{bmatrix} \qquad (19)$$

As stated above, the total error is assumed to be zero, and thus $\Delta t1 = -\Delta t2$. When utilizing this feature, the error can be detected as the difference between the outputs of the correlators 21.

When estimating a sampling time error, the gain of the coefficient A must be corrected as explained in the first embodiment. However, when the loop gain of feedback control is sufficiently large, the correction of the coefficient can be omitted since the influence of gain error is little in this case.

Similarly to the first embodiment, also in the second embodiment feedback control is performed so that the time errors $\Delta t1$ and $\Delta t2$ becomes zero in Formula (19).

As stated above, in the second embodiment, the number of A/D converting units 2 in the A/D converter 1a is small, and no gain control is required. Accordingly, if the digital output signal is a relatively stable signal, the structure of FIG. 5 is enough to correct the time error with high accuracy.

When using the A/D converter 1a in a wireless communication device, there is a fear that the digital output signal greatly varies and the coefficient A also greatly varies. In this case, by performing gain control similar to the first embodiment, the amplitude variation in the time error can be reduced and the feedback control of the time error can be settled in a short time.

(Third Embodiment)

In the first and second embodiments, the sampling time error of each A/D converting unit 2 is corrected by feeding back the final digital output signal outputted from the A/D converter 1. However, it is also possible to feed forward the error signal estimated by the A/D converted output signal outputted from each A/D converting unit 2.

FIG. 6 is a block diagram showing a schematic structure of an A/D converter 1b according to a third embodiment. The A/D converter 1b of FIG. 6 is different from the A/D converter 1 of FIG. 1 in that the signals inputted into the time error estimating device 16 are different, and that the integrator 15 is not provided. The other components are similar to FIG. 1.

The time error estimating device 16 of FIG. 6 is inputted with A/D converted output signals outputted from the A/D converting units 2. The internal structure of the time error estimating device 16 is similar to FIG. 2. Therefore, the correlator 21 of FIG. 2 estimates a correlation value representing the similarity between the A/D converted output signals. The weight adder 22 performs the weighting calculation in Formula (17) using the estimated correlation value, and performs gain control to cancel the coefficient A, thereby the sampling time error $\Delta ti$ of each A/D converting unit 2 being obtained.

As stated above, in the third embodiment, instead of feedback control using the final digital output signal of the A/D converter 1b, feedforward control is performed to obtain the time error by estimating the correlation between the A/D converted output signals in which no time error is corrected.

In the feedback control in the first and second embodiments, residual error in the corrected signal is estimated, and thus the time error can be corrected with high accuracy as a whole. On the other hand, in the feedforward control in the third embodiment, the prediction error is settled at nearly a constant value when a sufficient number of signal samples are gathered for calculating the correlation value. For example, even when changing the sample rate by the A/D converter 1b used in a communication system which changes signal bandwidth depending on communication situations, the sampling time correction value can be modified in a short time.

Based on such characteristics, in the third embodiment, accuracy is inferior compared to feedback control, but it is possible to settle the time error in a shorter time. Accordingly, the time since the operation of the A/D converter 1b is started until the final digital output signal is outputted from the A/D converter 1b can be shortened. Further, according to the third embodiment, since there is no need to provide the integrator 15 in the A/D converter 1b, the whole structure can be more simplified.

(Fourth Embodiment)

As stated above, in the examples explained in the first to third embodiments, a plurality of A/D converting units 2 are arranged in the A/D converter 1 to perform A/D conversion based on a time interleaving method. However, the A/D conversion based on this method can be realized by only one A/D converting unit 2. In a fourth embodiment explained below, A/D conversion based on the time interleaving method is performed by only one A/D converting unit 2.

FIG. 7 is a block diagram showing a schematic structure of an A/D converter 1c according to the fourth embodiment. The A/D converter 1c of FIG. 7 has one A/D converting unit 2, a demultiplexer (DEMUX) 4, and the error correction device 3. The internal structure of the error correction device 3 is similar to FIG. 1 and FIG. 6.

The A/D converting unit 2 is characterized in performing A/D conversion at higher speed than the A/D converting units 2 explained in the first to third embodiments.

The demultiplexer 4 sequentially classifies the A/D converted output signal outputted from the A/D converting unit 2 into a plurality of signals (four in the example of FIG. 7) each obtained within a predetermined time range. By arranging the demultiplexer 4, the A/D converted output signal from the A/D converting unit 2 operating at high speed can be processed in parallel, and the signal frequency for the parallel processing can be reduced. Accordingly, power consumption can be reduced.

However, when the high-speed A/D converted output signal is processed at lower speed and in parallel by the demultiplexer 4, consumption current of the power source line of the A/D converter 1c varies corresponding to the frequency of the parallelized signals, which leads to the variation in power-supply voltage. In particular, the power-supply voltage of a terminal farther from a power-supply terminal varies more easily. The amount of delay of a clock signal for A/D conversion correspondingly varies, which is a factor in generating a sampling time error.

The error correction device 3 of FIG. 7 can be used to correct such a sampling time error.

Similarly to the error correction device 3 as shown in FIG. 1 and FIG. 6, in the error correction device 3 of FIG. 7, the correlation value between final digital output signals or A/D converted output signals is obtained first, and then feedback control or feedforward control is performed based on a result obtained by adjusting the weight on the correlation value so that the sampling time error of the A/D converting unit 2 becomes zero.

As stated above, in the fourth embodiment, one A/D converting unit 2 operates at high speed and a plurality of A/D converted output signals are generated by the demultiplexer 4, which also makes it possible to correct the sampling time error of the A/D converting unit 2 with high accuracy.

In the first to fourth embodiments, the A/D converter 1c generates mainly two or four digital output signals based on a so-called two-way or four-way interleaving method, but there is no particular restrictions on the number of digital output signals to be interleaved. The above embodiments can be similarly employed when an odd number of digital output signals are generated as in the case of three-way or five-way interleaving. Further, the above embodiments can be similarly employed when a large number of digital output signals are interleaved as in the case of eight-way or sixteen-way interleaving.

The time error estimating device 16 in each of the above embodiments estimates the sampling time error of the A/D converter. However, the time error estimating device can be used not only for estimating the sampling time error of the A/D converting unit 2 but also for other purposes as other embodiments. As a concrete example, the time error estimating device 16 can be applied to correct the error of a switched capacitor circuit for performing time interleaving signal processing by an analog circuit after sampling an input signal, or to the error of a frequency conversion circuit having a plurality of outputs as typified by an orthogonal demodulation circuit. Further, when performing a time interleaving process for sequentially allocating a sampling output signal to a plurality of circuit blocks, an N-pass filter or a multiphase downconverter having a function of removing harmonic components is used, for example. In this specification, any circuit having a time error estimating device for performing the above time error correction process is called a time interleaving signal processing device as a whole.

At least a part of the A/D converter 1 explained in the above embodiments may be formed of hardware or software. In the case of software, a program realizing at least a partial function of the A/D converter 1 may be stored in a recording medium such as a flexible disc, CD-ROM, etc. to be read and executed by a computer. The recording medium is not limited to a removable medium such as a magnetic disk, optical disk, etc., and may be a fixed-type recording medium such as a hard disk device, memory, etc.

Further, a program realizing at least a partial function of the A/D converter 1 can be distributed through a communication line (including radio communication) such as the Internet. Furthermore, this program may be encrypted, modulated, and compressed to be distributed through a wired line or a radio link such as the Internet or through a recording medium storing it therein.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A time error estimating device for estimating a sampling time error of each of a plurality of sampling circuits when the sampling circuits generates a plurality of sampling output signals by performing sampling at timings shifted from one another, comprising:
correlators each configured to obtain a correlation value representing a similarity between the sampling output signals; and
a weight adder configured to estimate the sampling time errors of the sampling circuits, based on a result obtained by adjusting a weight on the correlation value,
wherein the weight adder comprises:
a weighting unit configured to weight the correlation value with a weight corresponding to the number of sampling circuits; and
a gain controller configured to control a gain of the correlation value weighted by the weighting unit, and to generate error signals representing the sampling time errors.

2. The time error estimating device of claim 1, further comprising:
a gain control signal generator configured to generate a gain control signal of the correlation value,
wherein the gain control signal generator comprises:
a multiplexer configured to select one of the sampling output signals;
a differential value estimator configured to differentiate the output signal of the multiplexer;
a delay unit configured to delay the signal selected by the multiplexer by a processing time of the differential value estimator;
a gain correlator configured to generate a correlation value between an output signal of the differential value estimator and an output signal of the delay unit; and
a reciprocal calculator configured to calculate a reciprocal of the correlation value generated by the gain correlator, as the gain.

3. A time error estimating device for estimating a sampling time error of each of a plurality of sampling circuits when the sampling circuits generates a plurality of sampling output signals by performing sampling at timings shifted from one another, comprising:
correlators each configured to obtain a correlation value representing a similarity between the sampling output signals; and
a weight adder configured to estimate the sampling time errors of the sampling circuits based on a result obtained by adjusting a weight on the correlation value,
wherein the weight adder generates an error signal representing the sampling time error by directly using a value obtained by weighting the correlation value with a weight corresponding to the number of sampling circuits, without performing gain control.

4. A time error estimating device for estimating a sampling time error of each of a plurality of sampling circuits when the sampling circuits generates a plurality of sampling output signals by performing sampling at timings shifted from one another, comprising:
correlators each configured to obtain a correlation value representing a similarity between the sampling output signals;
a weight adder configured to estimate the sampling time errors of the sampling circuits, based on a result obtained by adjusting a weight on the correlation value; and
highpass filters each configured to remove a direct current component from the output signal of the sampling circuit or the sampling output signal,
wherein each of the correlators obtains a correlation value between a plurality of signals passed through the highpass filters.

5. An error correction device, comprising:
a plurality of sampling circuits configured to perform sampling of an input signal at timings shifted from one another;
a first differential value estimator configured to estimate a differential value of the input signal using output signals of the sampling circuits;
a plurality of first delay units each configured to delay the output signal of the sampling circuit;

error removers each configured to generate a sampling output signal by removing a sampling time error of the sampling circuit from an output signal of the first delay unit; and a time error estimating device configured to generate an error signal corresponding to the sampling time error, wherein the time error estimating device comprises:

correlators each configured to obtain a correlation value between the sampling output signals or the output signals of the sampling circuits; and a weight adder configured to estimate the sampling time error of the sampling circuit, based on a result obtained by adjusting a weight on the correlation value by the differential value of an input signal estimated by the corrected output signal or the output signal of the sampling circuit.

6. The error correction device of claim 5, wherein the weight adder comprises:

a weighting unit configured to weight the correlation value with a weight corresponding to the number of sampling circuits; and a gain controller configured to control a gain of the correlation value weighted by the weighting unit, and to generate an error signal representing the sampling time error.

7. The error correction device of claim 6, further comprising:

a gain control signal generator configured to generate a gain control signal of the correlation value, wherein the gain control signal generator comprises:

a multiplexer configured to select one of the sampling output signals;

a second differential value estimator configured to differentiate the output signal of the multiplexer;

a second delay unit configured to delay the output signal of the multiplexer by a processing time of the second differential value estimator;

a gain correlator configured to generate a correlation value between an output signal of the second differential value estimator and an output signal of the second delay unit; and a reciprocal calculator configured to calculate a reciprocal of the correlation value generated by the gain correlator, as the gain.

8. The error correction device of claim 5, wherein the weight adder generates an error signal representing the sampling time error by directly using a value obtained by weighting the correlation value with a weight corresponding to the number of sampling circuits, without performing gain control.

9. The error correction device of claim 5, further comprising:

highpass filters each configured to remove a direct current component from the output signal of the sampling circuit or the sampling output signal, wherein each of the correlators obtains a correlation value between a plurality of signals passed through the highpass filters.

10. The error correction device of claim 5, further comprising:

an integration circuit configured to accumulate the error signal within a predetermined time range; and multipliers each configured to multiply the error signal accumulated by the integration circuit and the differential value, wherein the error remover generates the corrected output signal based on a difference between an output signal of the first delay unit and an output signal of the multiplier.

11. The error correction device of claim 10, wherein the time error estimating device generates the error signal so that an output of the integration circuit becomes zero.

12. The A/D converter of claim 11, wherein the time error estimating device generates the error signal so that an output of the integration circuit becomes zero.

13. The error correction device of claim 5, wherein the sampling circuits include a plurality of A/D converters.

14. An A/D converter, comprising:

a single A/D converting unit configured to perform A/D conversion;

a demultiplexer configured to classify an output signal of the A/D converting unit into a plurality of A/D converted output signals each obtained within a predetermined time range;

a first differential value estimator configured to estimate a differential value of an input signal using the A/D converted output signals;

a plurality of first delay units each configured to delay the A/D converted output signals;

error removers each configured to generate a sampling output signal by removing a sampling time error of the A/D converted output signals from an output signal of the first delay unit; and a time error estimating device configured to generate an error signal corresponding to the sampling time error, wherein the time error estimating device comprises:

correlators each configured to obtain a correlation value between the sampling output signals or the A/D converted output signals; and a weight adder configured to estimate the sampling time error of the A/D converted output signals, based on a result obtained by adjusting a weight on the correlation value with a differential value of the A/D converted output signal.

15. The A/D converter of claim 14, wherein the weight adder comprises:

a weighting unit configured to weight the correlation value with a weight corresponding to the number of the A/D converted output signals; and a gain controller configured to control a gain of the correlation value weighted by the weighting unit, and to generate an error signal representing the sampling time error.

16. The A/D converter of claim 15, further comprising:

a gain control signal generator configured to generate a gain of the correlation value, wherein the gain control signal generator comprises:

a multiplexer configured to select one of the sampling output signals;

a second differential value estimator configured to differentiate the output signal of the multiplexer;

a second delay unit configured to delay the signal selected by the multiplexer by a processing time of the second differential value estimator;

a gain correlator configured to generate a correlation value between an output signal of the second differential value estimator and an output signal of the second delay unit; and a reciprocal calculator configured to calculate a reciprocal of the correlation value generated by the gain correlator, as the gain.

17. The A/D converter of claim 14, wherein the weight adder generates an error signal representing the sampling time error by directly using a value obtained by weighting the correlation value with a weight corresponding to the number of the A/D converted output signals, without performing gain control.

18. The A/D converter of claim 14, further comprising:
highpass filters each configured to remove a direct current component from the A/D converted output signals or the sampling output signals,
wherein each of the correlators obtains a correlation value between a plurality of signals passed through the highpass filters.

19. The A/D converter of claim 14, further comprising:
an integration circuit configured to accumulate the error signal within a predetermined time range; and
multipliers each configured to multiply the error signal accumulated by the integration circuit and the differential value,
wherein the error remover generates the sampling output signal based on a difference between an output signal of the first delay unit and an output signal of the multiplier.

* * * * *